United States Patent
Yamato et al.

(10) Patent No.: US 9,422,454 B2
(45) Date of Patent: Aug. 23, 2016

(54) POLISHING COMPOSITION, POLISHING METHOD USING SAME, AND METHOD FOR PRODUCING SUBSTRATE

(71) Applicant: FUJIMI INCORPORATED, Kiyosu-shi, Aichi (JP)

(72) Inventors: Yasuyuki Yamato, Kiyosu (JP); Tomohiko Akatsuka, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 14/400,646

(22) PCT Filed: Apr. 4, 2013

(86) PCT No.: PCT/JP2013/060347
§ 371 (c)(1),
(2) Date: Nov. 12, 2014

(87) PCT Pub. No.: WO2013/172111
PCT Pub. Date: Nov. 21, 2013

(65) Prior Publication Data
US 2015/0132955 A1    May 14, 2015

(30) Foreign Application Priority Data

May 18, 2012 (JP) ................................. 2012-114596

(51) Int. Cl.
| | |
|---|---|
| C09G 1/02 | (2006.01) |
| H01L 21/3105 | (2006.01) |
| B24B 37/04 | (2012.01) |
| C09K 3/14 | (2006.01) |
| H01L 21/762 | (2006.01) |

(52) U.S. Cl.
CPC ............... *C09G 1/02* (2013.01); *B24B 37/044* (2013.01); *C09K 3/1436* (2013.01); *C09K 3/1463* (2013.01); *H01L 21/31053* (2013.01); *H01L 21/31055* (2013.01); *H01L 21/76224* (2013.01)

(58) Field of Classification Search
None
See application file for complete search history.

(56) References Cited

U.S. PATENT DOCUMENTS

| | | | | |
|---|---|---|---|---|
| 6,776,810 B1 * | 8/2004 | Cherian | ................ | B24B 37/044 106/3 |
| 7,695,637 B2 * | 4/2010 | Park | ................ | C09G 1/02 252/79.1 |
| 2002/0011031 A1 * | 1/2002 | Hattori | ................ | H01L 21/31053 51/308 |
| 2003/0124959 A1 * | 7/2003 | Schroeder | ................ | C09G 1/02 451/41 |
| 2003/0166381 A1 | 9/2003 | Lee et al. | | |
| 2003/0211815 A1 | 11/2003 | Carter et al. | | |
| 2004/0123527 A1 * | 7/2004 | Kitayama | ................ | C09G 1/02 51/307 |
| 2004/0235396 A1 * | 11/2004 | Hattori | ................ | H01L 21/31053 451/41 |
| 2005/0076581 A1 * | 4/2005 | Small | ................ | B24B 37/044 51/307 |
| 2005/0126080 A1 | 6/2005 | Kon et al. | | |
| 2006/0096179 A1 | 5/2006 | Lu et al. | | |
| 2006/0213126 A1 * | 9/2006 | Cho | ................ | C09G 1/02 51/298 |
| 2007/0218811 A1 | 9/2007 | Kurata et al. | | |
| 2008/0254717 A1 | 10/2008 | Fukasawa et al. | | |
| 2009/0181539 A1 | 7/2009 | Kon et al. | | |
| 2010/0055909 A1 | 3/2010 | Kon et al. | | |
| 2010/0221918 A1 * | 9/2010 | Takemura | ................ | H01L 21/3212 438/693 |
| 2012/0270400 A1 * | 10/2012 | Takegoshi | ................ | C09G 1/02 438/692 |
| 2013/0005219 A1 | 1/2013 | Takemura et al. | | |
| 2013/0072021 A1 * | 3/2013 | Cui | ................ | H01L 21/3212 438/693 |

FOREIGN PATENT DOCUMENTS

| | | | |
|---|---|---|---|
| EP | 1 104 778 A2 | 6/2001 | |
| GB | 2 390 370 A | 1/2004 | |
| JP | 2004-031905 A | 1/2004 | |
| JP | 2006-041252 A | 2/2006 | |
| JP | 2006-041552 A | 2/2006 | |
| JP | 2006-318952 A | 11/2006 | |
| JP | 2011-181884 A | 9/2011 | |
| JP | 2011-181946 A | 9/2011 | |
| WO | WO 2004/010487 A1 | 1/2004 | |
| WO | WO 2006/035779 A1 | 4/2006 | |
| WO | WO 2008/032681 A1 | 3/2008 | |
| WO | WO-2008/070113 A1 | 6/2008 | |
| WO | WO 2011/093153 A1 | 8/2011 | |

OTHER PUBLICATIONS

Surface functionalized titanium thin films: Zeta-potential, protein adsorption and cell proliferation. Kaiyong Cai, Marion Frant, Jorg Bossert, Gerhard Hildebrand, Klaus Liefeith, Klaus D. Jandt. Colloids and Surfaces B: Biointerfaces vol. 50, Issue 1, pp. 1-8; Jun. 1, 2006.*
Chinese Office Action dated May 25, 2016 as received in corresponding Chinese Application No. 201380025124.9 and its English translation thereof.

* cited by examiner

*Primary Examiner* — Allan Olsen
(74) *Attorney, Agent, or Firm* — Foley & Lardner LLP

(57) ABSTRACT

A polishing composition of the present invention contains a water-soluble polymer and abrasive grains. The water-soluble polymer is an anionic compound having an acid dissociation constant pKa of 3 or less. Specific examples of such a compound include polyvinylsulfonic acid, polystyrenesulfonic acid, polyallylsulfonic acid, polyethyl acrylate sulfonic acid, polybutyl acrylate sulfonic acid, poly(2-acrylamide-2-methylpropanesulfonic acid), and polyisoprenesulfonic acid. The abrasive grains exhibit a negative zeta potential at a pH of 3.5 or less. Specific examples of such abrasive grains include colloidal silica.

15 Claims, No Drawings

POLISHING COMPOSITION, POLISHING METHOD USING SAME, AND METHOD FOR PRODUCING SUBSTRATE

TECHNICAL FIELD

The present invention relates to a polishing composition used, for example, for polishing an object having a silicon nitride layer and a silicon oxide layer formed on the silicon nitride layer. The present invention also relates to a polishing method and a substrate production method using the polishing composition.

BACKGROUND ART

Polishing processes in semiconductor device manufacturing are generally carried out by chemical mechanical polishing (CMP). Specifically, CMP is used in processes such as shallow trench isolation (STI), planarization of interlayer dielectric films (ILD films), formation of tungsten plugs, and formation of multilayer interconnections composed of copper and a low dielectric film. In STI, one of these processes, it is typical for a silicon oxide layer to be polished and removed by CMP using a silicon nitride layer as a stopper.

As disclosed in Patent Documents 1, 2, and 3, use of cerium oxide abrasive grains is known in specific CMP applications such as STI. Cerium oxide abrasive grains are suitable for use in such applications in that they have an ability to polish and remove silicon oxide more selectively than silicon nitride. Cerium oxide abrasive grains, however, are generally expensive and also disadvantageous in that they easily settle out, thereby being poor in storage stability. Therefore, there has been a need for substituting other abrasive grains such as colloidal silica for cerium oxide abrasive grains. When a polishing composition containing other abrasive grains in place of cerium oxide abrasive grains is used in the same application, the important thing is how to decrease the polishing rate of silicon nitride with the polishing composition without decreasing the polishing rate of silicon oxide.

PATENT DOCUMENTS

Patent Document 1: International Publication No. WO 2004/010487
Patent Document 2: International Publication No. WO 2008/032681
Patent Document 3: Japanese Laid-Open Patent Publication No. 2011-181946

SUMMARY OF INVENTION

Problems that the Invention is to Solve

Accordingly, an objective of the present invention is to provide a polishing composition capable of being used in specific CMP applications such as STI as an alternative to that containing cerium oxide abrasive grains and also to provide a polishing method and a substrate production method using the polishing composition.

Means for Solving the Problems

In order to achieve the objectives described above and in accordance with a first aspect of the present invention, a polishing composition is provided that contains an anionic and water-soluble polymer and abrasive grains. The water-soluble polymer has an acid dissociation constant pKa of 3 or less. The abrasive grains exhibit a negative zeta potential at a pH of 3.5 or less.

The polishing composition preferably has a pH of 3.5 or less.

The water-soluble polymer has, for example, a sulfo group.

The abrasive grains are, for example, colloidal silica on which an organic acid is immobilized.

In accordance with a second aspect of the present invention, a polishing method is provided that includes using the polishing composition according to the first aspect to polish an object having a first layer and a second layer formed on the first layer, in which the first layer exhibits a positive zeta potential at a pH of 3.5 or less and the second layer is formed of a different material from that of the first layer.

In accordance with a third aspect of the present invention, a substrate production method is provided that includes using the polishing composition according to the first aspect to polish an object having a first layer and a second layer formed on the first layer, in which the first layer exhibits a positive zeta potential at a pH of 3.5 or less and the second layer is formed of a different material from that of the first layer.

Effects of the Invention

The present invention succeeds in providing a polishing composition capable of being used in specific CMP applications such as STI as an alternative to that containing cerium oxide abrasive grains and also a polishing method and a substrate production method using the polishing composition.

MODES FOR CARRYING OUT THE INVENTION

One embodiment of the present invention will now be described.

A polishing composition according to the present embodiment is prepared by mixing a water-soluble polymer and abrasive grains with water. Therefore, the polishing composition contains a water-soluble polymer and abrasive grains.

The polishing composition of the present embodiment is used for polishing an object having a silicon nitride layer and a silicon oxide layer formed directly on the silicon nitride layer, and more specifically, for polishing such an object to produce a substrate. The silicon nitride layer exhibits a positive zeta potential at a pH of 3.5 or less.

Since the polishing composition of the present embodiment is not particularly intended to be used for polishing a metal, the polishing composition does not contain an oxidizing agent and a metal anticorrosive agent, which are typical examples of components contained in a metal polishing composition.

<Water-Soluble Polymer>

The water-soluble polymer contained in the polishing composition is an anionic compound having an acid dissociation constant pKa of 3 or less and has an anionic group, such as a sulfo group and a phosphonic group. Specific examples of such compounds include polyvinylsulfonic acid, polystyrenesulfonic acid, polyallylsulfonic acid, polyethyl acrylate sulfonic acid, polybutyl acrylate sulfonic acid, poly(2-acrylamide-2-methylpropanesulfonic acid), polyisoprenesulfonic acid, and salts of these acids.

When the polishing composition is used for polishing the object described above, the water-soluble polymer in the polishing composition is adsorbed on the surface of the silicon nitride layer exposed when the silicon oxide layer is polished and removed, thereby serving to prevent the silicon nitride layer from being polished with the polishing composition.

The content of the water-soluble polymer in the polishing composition is preferably 10 ppm by mass or more, more preferably 50 ppm by mass or more, and still more preferably 100 ppm by mass or more. As the content of the water-soluble polymer increases, the sufficient amount of the water-soluble polymer to prevent the silicon nitride layer from being polished with the polishing composition is easily adsorbed on the silicon nitride layer surface.

The content of the water-soluble polymer in the polishing composition is also preferable 100,000 ppm by mass or less, more preferably 50,000 ppm by mass or less, and still more preferably 10,000 ppm by mass or less. As the content of the water-soluble polymer decreases, the abrasive grains in the polishing composition are less likely to flocculate. This provides an advantageous effect of enhancing storage stability of the polishing composition.

The molecular weight of the water-soluble polymer in the polishing composition is preferably 100 or more, and more preferably 300 or more. As the molecular weight of the water-soluble polymer increases, the sufficient amount of the water-soluble polymer to prevent the silicon nitride layer from being polished with the polishing composition is easily adsorbed on the silicon nitride layer surface.

The molecular weight of the water-soluble polymer in the polishing composition is preferably 500,000 or less, and more preferably 300,000 or less. As the molecular weight of the water-soluble polymer decreases, the abrasive grains in the polishing composition are less likely to flocculate. This provides an advantageous effect of enhancing storage stability of the polishing composition.

The water-soluble polymer has a ratio of the number of the monomer unit having the anionic group to the total number of the monomer units in the water-soluble polymer of preferably 10% or more. As the ratio increases, the sufficient amount of the water-soluble polymer to prevent the silicon nitride layer from being polished with the polishing composition is easily adsorbed on the silicon nitride layer surface.

<Abrasive Grains>

The abrasive grains contained in the polishing composition exhibit a negative zeta potential at a pH of 3.5 or less. The type of the abrasive grains used is not particularly limited, provided that the abrasive grains exhibit a negative zeta potential at a pH of 3.5 or less. For example, surface-modified colloidal silica can be used. Surface modification of colloidal silica can be performed by, for example, mixing a metal, such as aluminum, titanium, and zirconium, or a metal oxide with colloidal silica to dope the metal component to the silica particle surfaces. Alternatively, surface modification of colloidal silica can be also performed by chemically bonding a functional group of an organic acid to the silica particle surface, i.e., immobilization of an organic acid. The immobilization of an organic acid on colloidal silica cannot be accomplished by only allowing the colloidal silica and the organic acid to coexist. The immobilization of a sulfonic acid, which is one of organic acids, on colloidal silica can be performed, for example, by the method described in "Sulfonicacid-functionalized silica through of thiol groups", Chem. Commun. 246-247 (2003). Specifically, colloidal silica having a sulfonic acid immobilized on the particle surfaces thereof can be obtained by coupling a silane coupling agent having a thiol group, such as 3-mercaptopropyl trimethoxysilane, to colloidal silica, followed by oxidizing the thiol group with hydrogen peroxide. The immobilization of a carboxylic acid on colloidal silica can be performed, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, colloidal silica having a carboxylic acid immobilized on the particle surfaces thereof can be obtained by coupling a silane coupling agent containing photoreactive 2-nitrobenzyl ester to colloidal silica, followed by photoirradiation.

The content of the abrasive grains in the polishing composition is preferably 0.1% by mass or more, more preferably 0.5% by mass or more, and still more preferably 1% by mass or more. As the content of the abrasive grains increases, the rate of polishing the silicon oxide layer with the polishing composition is advantageously enhanced.

The content of the abrasive grains in the polishing composition is also preferably 20% by mass or less, more preferably 15% by mass or less, and still more preferably 10% by mass or less. As the content of the abrasive grains decreases, the material cost of the polishing composition is reduced and the abrasive grains are less like to flocculate. In addition, a polished surface with fewer scratches is easily obtained by polishing the object with the polishing composition.

The average primary particle diameter of the abrasive grains is preferably 5 nm or more, more preferably 7 nm or more, and still more preferably 10 nm or more. As the average primary particle diameter of the abrasive grains increases, the rate of polishing the silicon oxide layer with the polishing composition is advantageously enhanced. The average primary particle diameter value of the abrasive grains can be calculated, for example, based on the specific surface area of the abrasive grains determined by the BET method.

The average primary particle diameter of the abrasive grains is also preferably 100 nm or less, more preferably 90 nm or less, and still more preferably 80 nm or less. As the average primary particle diameter of the abrasive grains decreases, a polished surface with fewer scratches is easily obtained by polishing the object with the polishing composition.

The average secondary particle diameter of the abrasive grains is preferably 150 nm or less, more preferably 120 nm or less, and still more preferably 100 nm or less. The average secondary particle diameter value of the abrasive grains can be determined by, for example, the laser light scattering method.

The average degree of association of the abrasive grains, which is obtained by dividing the average secondary particle diameter value of the abrasive grains by the average primary particle diameter value thereof, is preferably 1.2 or more, and more preferably 1.5 or more. As the average degree of association of the abrasive grains increases, the rate of polishing the silicon oxide layer with the polishing composition is advantageously enhanced.

The average degree of association of the abrasive grains is also preferably 4 or less, more preferably 3 or less, and still more preferably 2 or less. As the average degree of association of the abrasive grains decreases, a polished surface with fewer scratches is easily obtained by polishing the object with the polishing composition.

<pH of the Polishing Composition>

The pH of the polishing composition is preferably 6.0 or less, more preferably 4.0 or less, and still more preferably 3.5 or less. As the pH of the polishing composition decreases, the rate of polishing the silicon oxide layer with the polishing composition is advantageously enhanced.

A pH adjusting agent may be used in order to adjust the pH of the polishing composition to a desired value. The pH adjusting agent used may be either an acid or an alkali and either an inorganic or organic compound.

According to the present embodiment, the following effects and advantages are obtained:

The polishing composition of the present embodiment contains an anionic and water-soluble polymer having an acid dissociation constant pKa of 3 or less. Therefore, when the polishing composition is used for polishing an object having a silicon nitride layer and a silicon oxide layer formed on the silicon nitride layer, the water-soluble polymer is adsorbed on the surface of the silicon nitride layer exposed when the silicon oxide layer is polished and removed. This adsorption produces a spatial blockage preventing the abrasive grains from approaching the silicon nitride layer surface, thereby preventing the silicon nitride layer from being polished with the polishing composition. In addition, change of the zeta potential on the silicon nitride layer surface from a positive value to a negative value due to the adsorption of the water-soluble polymer results in electrostatic repulsion of the abrasive grains against the silicon nitride layer and this also causes prevention of polishing of the silicon nitride layer with the polishing composition. Thus, the rate of polishing silicon nitride with the polishing composition is reduced. On the other hand, the water-soluble polymer is not adsorbed on the silicon oxide layer surface, and therefore, the rate of polishing silicon oxide with the polishing composition is not reduced. Consequently, it is possible to polish and remove silicon oxide more selectively than silicon nitride, and more specifically, to regulate the quotient of the polishing rate of silicon oxide divided by the polishing rate of silicon nitride to, for example, 5 or more, and specifically 10 or more or 20 or more. Accordingly, the silicon oxide layer can be polished and removed using the silicon nitride layer as a stopper and the polishing composition of the present embodiment is suitably used in CMP applications, such as STI, including such a process.

When the abrasive grains contained in the polishing composition is colloidal silica on which an organic acid is immobilized, this results in the polishing composition particularly excellent in storage stability. This is because that colloidal silica on which an organic acid is immobilized tends to exhibit a larger absolute value of the zeta potential in the polishing composition, as compared to standard colloidal silica, on which an organic acid is not immobilized. As the absolute value of the zeta potential in the polishing composition increases, the electrostatic repulsion between the silica particles is increased, thereby being less likely to lead to flocculation of the colloidal silica caused by an attracting force due to van der Waals force. In an acidic pH region, for example, colloidal silica on which an organic acid is immobilized typically exhibits a negative zeta potential value of −15 mV or less, while standard colloidal silica exhibits a zeta potential value close to zero.

The embodiment described above may be modified as follows.

The polishing composition of the embodiment described above may contain two or more types of water-soluble polymers. In this case, part of the water-soluble polymers are not each required to necessarily be an anionic compound having an acid dissociating constant pKa of 3 or less.

The polishing composition of the embodiment described above may contain two or more types of abrasive grains. In this case, part of the abrasive grains are not required to necessarily be those exhibiting a negative zeta potential at a pH of 3.5 or less.

The polishing composition of the embodiment described above may contain an ammonium salt or alkali metal salt of an organic acid, such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid. Alternatively, the polishing composition of the embodiment described above may contain an ammonium salt or alkali metal salt of an inorganic acid, such as sulfuric acid, nitric acid, phosphoric acid, and boric acid. These ammonium salts and alkali metal salts function as a polishing promoter for enhancing the rate of polishing the silicon oxide layer with the polishing composition.

The polishing composition of the embodiment described above may further contain a known additive, such as a preservative agent, as necessary. In addition, the polishing composition of the embodiment described above may further contain an oxidizing agent or a metal anti-corrosive agent.

The polishing composition of the embodiment described above may be of either a one-pack type or a multi-pack type, such as a two-pack type.

The polishing composition of the embodiment described above may be prepared by diluting an undiluted solution of the polishing composition with water.

The polishing composition of the embodiment described above may be used in an application other than polishing an object having a silicon nitride layer and a silicon oxide layer formed on the silicon nitride layer. The polishing composition may be used, for example, for polishing an object having a silicon nitride layer and a layer that is composed of a material other than silicon oxide and is formed on the silicon nitride layer. Alternatively, the polishing composition may be used for polishing an object having a layer that is composed of a material other than silicon nitride and exhibits a positive zeta potential at a pH of 3.5 or less and a silicon oxide layer formed on such a layer.

Next, examples and comparative examples will be described.

Colloidal silica sol was diluted with water, and then the pH value of the diluted colloidal silica sol was adjusted to 3.0 by adding an organic acid as a pH adjusting agent thereto to prepare a polishing composition of Comparative Example 1. Colloidal silica sol was diluted with water, and then 1,000 ppm by mass of a water-soluble polymer was added to the diluted colloidal silica sol followed by adding an organic acid to adjust the pH value to 3.0. Thus, polishing compositions of Examples 1 and 2 and Comparative Examples 2, 3, and 4 were prepared. The detail of the water-soluble polymer in each polishing composition is shown in Table 1.

Each of the polishing compositions of Examples 1 and 2 and Comparative Examples 1 to 4 contains 5% by mass of colloidal silica on which sulfonic acid is immobilized (average primary particle diameter of 35 nm, average secondary particle diameter of 70 nm, and average degree of association of 2) and 0.5% by mass of an inorganic ammonium salt as a polishing promoter, which are not shown in Table 1.

TABLE 1

|  | Type of water-soluble polymer | pKa of water-soluble polymer | Molecular weight of water-soluble polymer |
|---|---|---|---|
| Comparative Example 1 | — | — | — |
| Comparative Example 2 | polyacrylic acid | 4.3 | 20,000 to 30,000 |
| Comparative Example 3 | polymaleic acid | 3.1 or less and 4.0 or more | 8,000 |
| Comparative Example 4 | polymaleic acid-polyacrylic acid copolymer | 3.1 or less and 4.0 or more | 3,000 |
| Example 1 | polyisoprenesulfonic acid | 3.0 or less | 20,000 |
| Example 2 | polystyrenesulfonic acid | 3.0 or less | 10,000 |

The polishing rate of silicon oxide, which was determined when a silicon oxide film blanket wafer having a diameter of 200 mm was polished using each of the polishing compositions of Examples 1 and 2 and Comparative Examples 1 to 4 for 1 minute under the conditions described in Table 2, is shown in the column "Polishing rate of silicon oxide" in Table 3. Each polishing rate value of silicon oxide was determined by dividing by polishing time the difference in the thickness of each wafer before and after polishing, measured using an optical interference type film thickness measuring device.

The polishing rate of silicon nitride, which was determined when a silicon nitride film blanket wafer having a diameter of 200 mm was polished using each of the polishing compositions of Examples 1 and 2 and Comparative Examples 1 to 4 for 1 minute under the conditions described in Table 2, is shown in the column "Polishing rate of silicon nitride" in Table 3. Each polishing rate value of silicon nitride was determined by dividing by polishing time the difference in the thickness of each wafer before and after polishing, measured using an optical interference type film thickness measuring device.

Each value obtained by dividing the polishing rate of silicon oxide determined for each of the polishing compositions of Examples 1 and 2 and Comparative Examples 1 to 4 by the polishing rate of silicon nitride determined for the same polishing composition is shown in the column "Polishing rate of silicon oxide/polishing rate of silicon nitride" in Table 3.

TABLE 2

| Polishing machine: Polishing machine for single-side CMP |
| Polishing pad: Polyurethane pad |
| Polishing pressure: 2 psi (about 28 kPa) |
| Platen rotation rate: 100 rpm |
| Polishing composition: Used without recycling |
| Carrier rotation rate: 100 rpm |

TABLE 3

|  | Polishing rate of silicon oxide [Å/min] | Polishing rate of silicon nitride [Å/min] | Polishing rate of silicon oxide/ polishing rate of silicon nitride |
|---|---|---|---|
| Comparative Example 1 | 400 | 400 | 1.0 |
| Comparative Example 2 | 400 | 380 | 1.1 |
| Comparative Example 3 | 400 | 370 | 1.1 |
| Comparative Example 4 | 400 | 400 | 1.0 |
| Example 1 | 400 | 10 | 40 |
| Example 2 | 400 | 10 | 40 |

As shown in Table 3, when the polishing composition of each of Examples 1 and 2 was used, the value obtained by dividing the polishing rate of silicon oxide by the polishing rate of silicon nitride was as high as 40 and the obtained results show that these polishing compositions can be satisfactorily used to polish and remove silicon oxide more selectively than silicon nitride.

On the other hand, when the polishing composition of each of Comparative Examples 1 to 4, which does not contain an anionic and water-soluble polymer having an acid dissociation constant pKa of 3 or less, was used, the value obtained by dividing the polishing rate of silicon oxide by the polishing rate of silicon nitride was as low as about 1 and the obtained results show that these polishing compositions cannot be satisfactorily used to polish and remove silicon oxide more selectively than silicon nitride.

The invention claimed is:

1. A polishing composition used for polishing an object having a first layer and a second layer, wherein:
   the second layer is formed on the first layer;
   the first layer exhibits a positive zeta potential at a pH of 3.5 or less; and
   the second layer is formed of a different material from that of the first layer,
   the polishing composition comprising an anionic and water-soluble polymer and abrasive grains, wherein:
   the water-soluble polymer has an acid dissociation constant pKa of 3 or less;
   the abrasive grains are colloidal silica on which an organic acid is immobilized; and
   the abrasive grains exhibit a negative zeta potential at a pH of 3.5 or less.

2. The polishing composition according to claim 1, wherein the polishing composition has a of 3.5 or less.

3. The polishing composition according to claim 1, wherein the water-soluble polymer has a sulfo group.

4. The polishing composition according to claim 1, wherein the first layer is a silicon nitride layer.

5. The polishing composition according to claim 1, wherein the water-soluble polymer is selected from the group consisting of polyvinylsulfonic acid, polystyrenesulfonic acid, polyallylsulfonic acid, polyethyl acrylate sulfonic acid, polybutyl acrylate sulfonic acid, poly(2-acrylamide-2-methylpropanesulfonic acid), polyisoprenesulfonic acid, and salts of these acids.

6. The polishing composition according to claim 1, wherein the water-soluble polymer is contained in the polishing composition in an amount of 10 ppm by mass or more and 100,000 ppm by mass or less.

7. The polishing composition according to claim 1, wherein the organic acid is a sulfonic acid.

8. A polishing method comprising:
   providing an object having a first layer and a second layer, wherein:
   the second layer is formed on the first layer;
   the first layer exhibits a positive zeta potential at a pH of 3.5 or less; and the second layer is formed of a different material from that of the first layer; and using the polishing composition according to claim 1 to polish the object.

9. A method for producing a substrate, comprising:

providing an object having a first layer and a second layer, wherein:

the second layer is formed on the first layer;

the first layer exhibits a positive zeta potential at a pH of 3.5 or less; and the second layer is formed of a different material from that of the first layer; and using the polishing composition according to claim 1 to polish the object.

10. A polishing composition used for polishing an object having a first layer and a second layer, wherein:

the second layer is formed on the first layer;

the first layer is a silicon nitride layer and exhibits a positive zeta potential at a pH of 3.5 or less; and the second layer is formed of a different material from that of the first layer, the polishing composition comprising an anionic and water-soluble polymer and abrasive grains, wherein:

the water-soluble polymer has a sulfo group;

the water-soluble polymer has an acid dissociation constant pKa of 3 or less;

the abrasive grains are colloidal silica on which an organic acid is immobilized;

the abrasive grains exhibit a negative zeta potential at a pH 3.5 or less; and the polishing composition has a pH of 3.5 or less.

11. The polishing composition according to claim 10, wherein the water-soluble polymer is selected from the group consisting of polyvinylsulfonic acid, polystyrenesulfonic acid, polyallylsulfonic acid, polyethyl acrylate sulfonic acid, polybutyl acrylate sulfonic acid, poly(2-acrylamide-2-methylpropanesulfonic acid), polyisoprenesulfonic acid, and salts of these acids.

12. The polishing composition according to claim 11, wherein the water-soluble polymer is contained in the polishing composition in an amount of 10 ppm by mass or more and 100,000 ppm by mass or less.

13. The polishing composition according to claim 10, wherein the organic acid is a sulfonic acid.

14. A polishing method comprising:

providing an object having a first layer and a second layer, wherein:

the second layer is formed on the first layer;

the first layer is a silicon nitride layer and exhibits a positive zeta potential at a pH of 3.5 or less; and the second layer is formed of a different material from that of the first layer; and using the polishing composition according to claim 10 to polish the object.

15. A method for producing a substrate, comprising:

providing an object having a first layer and a second layer, wherein:

the second layer is formed on the first layer;

the first layer is a silicon nitride layer and exhibits a positive zeta potential at a pH of 3.5 or less; and the second layer is formed of a different material from that of the first layer; and using the polishing composition according to claim 10 to polish the object.

* * * * *